United States Patent [19]
Lish

[11] Patent Number: 5,043,814
[45] Date of Patent: Aug. 27, 1991

[54] ADAPTIVE GHOST CANCELLATION CIRCUIT

[75] Inventor: Charles A. Lish, Yorktown Heights, N.Y.

[73] Assignee: North American Philips Corporation, New York, N.Y.

[21] Appl. No.: 418,432

[22] Filed: Oct. 6, 1989

[51] Int. Cl.⁵ .............................................. H04N 5/21
[52] U.S. Cl. .................................... 358/166; 358/905
[58] Field of Search ................... 358/166, 167, 36, 37, 358/905

[56] References Cited
U.S. PATENT DOCUMENTS

| 4,344,089 | 8/1982 | Utsunomiya | 358/905 |
| 4,476,491 | 10/1984 | Murata | 358/905 |
| 4,502,077 | 2/1985 | Morotomi | 358/167 |
| 4,682,230 | 7/1987 | Perlman | 358/167 |

Primary Examiner—Tommy P. Chin
Attorney, Agent, or Firm—Michael E. Marion

[57] ABSTRACT

An adaptive ghost cancellation circuit comprises a transversal filter having a reduced set of multipliers. A predetermined reference signal in the transmitted video signal, and an identical reference signal generated in the ghost cancellation circuit are used to identify optimum active multiplier positions and values during the vertical retrace interval. The optimum filter is then used to cancel any ghosts from the receiver video signal.

5 Claims, 9 Drawing Sheets

- $A_c$ FOR 3X SAMPLED SINC COMBED AT 1/3 INTERVAL OR LESS IS VERY CLOSE TO TOEPLITZ

- SINGLE ECHO MAPPING:

PEAK POSITION NOT ALTERED

- MULTIPLE ECHO

MAXIMUM MAGNITUDES OF $W_c^*$ HAVE HIGH PROBABILITY OF MATCHING ACTIVE $W^*$ ELEMENTS

ADAPTIVE GHOST CANCELLATION CIRCUIT

BACKGROUND OF THE INVENTION

In video transmission, multipath reception caused by signal reflections off buildings or other terrestrial objects cause distinct, sometimes distorted time-shifted replicas or ghosts of the image to appear. Additionally, ghosting can be found in cable systems having poorly terminated connections.

It is an object of the invention to provide improvements in circuits and systems for ghost cancellation.

SUMMARY OF THE INVENTION

In examining the impulse response of a ghost channel, we find that it is sparse because most of the response values over time are zero. If an inverse filter of the channel were constructed to cancel the echo function, it too can be made sparse, not requiring a multiplier at every tap in its transversal delay line. According to the invention an adaptive ghost cancellation circuit comprises a transversal filter having a reduced set of multipliers. A predetermined reference signal in the transmitted video signal, and an identical reference signal generated in the ghost cancellation circuit are used to identify optimum active multiplier positions and values during the vertical retrace interval. The optimum filter is then used to cancel any ghosts from the received video signal.

DETAILED DESCRIPTION OF THE INVENTION

In order to facilitate description of the invention, a simple geometrical relationship based on Wiener filter theory is derived. Algorithms for clustering (i.e. locally grouping free multipliers at needed taps) based on the formulation are presented.

1. Adaptive Filtering

Figure 1:
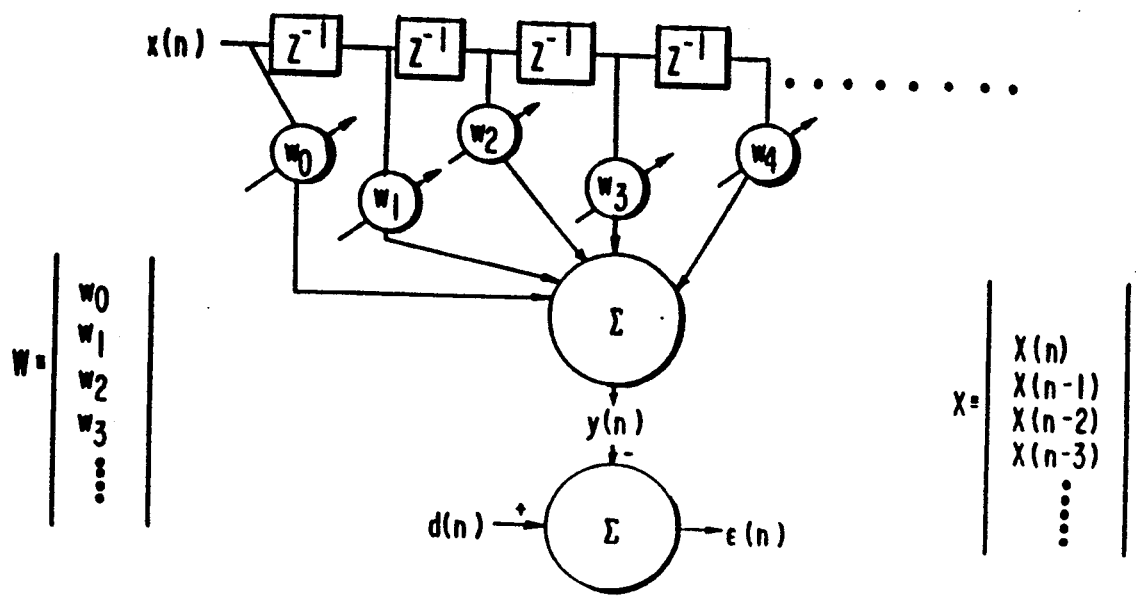
FIG. 1 illustrates conventional adaptive transversal filter.

In a finite impulse response (FIR) adaptive filters as shown in FIG. 1 the multiplier values or tap weights and signal are represented by $R^m$ vectors $W^T = \{W_0 \ldots W_{m-1}\}$ and $X^T = \{X(n) \ldots X(n-m+1)\}$, respectively. The filter output may then be written as $y(n) = X^T W = W^T X$. To tune the filter output to create a good replication of the reference signal $d(n)$ from input $X(n)$, the error $|\epsilon(n)|^K = |d(n) - y(n)|^K$ must be minimized. For ease of calculation it is desirable to set $K=2$ obtaining $$\epsilon^2(n) = d^2(n) + W^T X X^T W - 2d(n) X^T W \tag{1}$$

Expectation operator E is then applied to average out any noise as shown below.

$$e = E[\epsilon^2(n)] = E[d^2(n)] + W^T E[XX^T] W - 2E[d(n)X^T] W \tag{2}$$

where $e$ is the mean square error (MSE).

Figure 2:
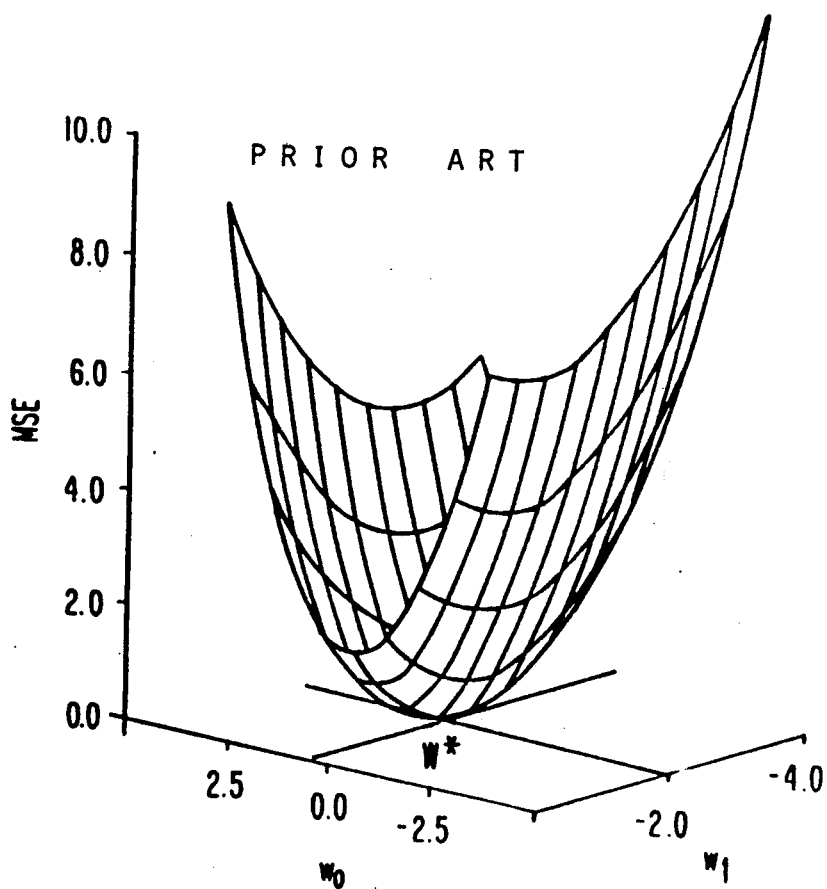
FIG. 2 shows the error surface for the filter of FIG. 1.

Minimization can then take place by writing the gradient of $e$ with respect to the tap weights obtaining $\nabla$, and then setting this quantity to '0' thus solving for the optimal weight vector $W^*$ as shown in FIG. 2 below. $W^*$ is known as the Wiener solution with $E[XX^T] = R$ being the input autocorrelation matrix.

$$\nabla = \partial e / \partial W = 2E[XX^T]W - 2E[d(n)X] \tag{3}$$

The condition $\nabla = 0$ yields the optimal solution $W^*$ given by eqn.(4).

$$W^* = E[XX^T]^{-1} E[d(n)X] \tag{4}$$

FIG. 2 shows an example of a two weight error surface. The quadratic shape of the error surface is determined by R and the center point is $W^*$. Below we describe how this surface is cut when multipliers are deleted from the FIR filter.

From eqn. (4), we can see the difficulty in calculating $W^*$. Long term averaging and complex matrix operations are needed. It is simpler to start with an initial guess of $W^*$ and then follow the gradient down the error surface to reach the actual optimum. Because $\nabla$ in eqn. (3) is also difficult to calculate, the least mean square (LMS) gradient estimate may be used. Instead of using an actual gradient, the expectation is dropped to obtain $$\hat{\nabla}(n) = \partial \epsilon^2(n) / \partial W = 2\epsilon(n) \partial \epsilon(n) / \partial W \tag{5}$$

The gradient estimate $\nabla(n)$ in final form is obtained after solving for $\partial \epsilon(n) / \partial W$ from $\epsilon(n) = d(n) - X^T W$.

$$\partial \epsilon(n) / \partial W(n) = -X(n) \rightarrow \hat{\nabla}(n) = -2\epsilon(n)X(n) \tag{6}$$

If $\nabla/(n)$ is time averaged at a particular W on the error surface, $\nabla \rightarrow \hat{\nabla}$ (closeness increasing with averaging time, weights are iterated to reach $W^*$ by following the gradient as shown below.

$$\begin{aligned} W(n+1) &= W(n) - \mu \hat{\nabla}(n) \\ &= W(n) + 2\mu\epsilon(n)X(n) \end{aligned} \tag{7}$$

Since the constant $\mu$ determines the rate of descent, the time average of $\nabla$ and thus precision is sacrificed when using large $\mu$. There is a compromise between speed and accuracy of adaptation.

A thorough treatment of adaptive filtering can be found in the text: Widrow & Stearns, "Adaptive Signal Processing", Prentice-Hall (1985).

2. Ghost Cancellation

The image portion of a video signal such as occurs in television broadcasting, is not known to the receiver before reception, thus making it undesirable as a reference signal [d(n)] for adaptive filtering. In the system according to the invention a standardized reference signal is inserted in the vertical interval test signal (VITS) during vertical retrace. A circuit in the receiver generates an identical reference signal simultaneously with the VITS transmitted reference (which is corrupted by an unknown linear ghosting function h(n) before it is received). A signal x(n)=d(n) * h(n) is applied to an adaptive FIR filter input, the tap weights may then be adapted to minimize the error e. The FIR filter then approximates inverse ghosting function $h^{-1}(n)$; when the picture portion of the signal is passed through the FIR significant ghost reduction takes place. A FIR filter cannot provide complete cancellation, however, because ghosting function h(n) is a finite convolution, and thus has an all zero transfer function. The inverse all pole filter must have infinite impulses response (IIR) for complete cancellation.

The error surface of an IIR adaptive filter is not quadratic and may also have local minima. Additionally, the LMS gradient estimate has recursive terms, making it more complex than the FIR counterpart. Below, we show that it is possible to adapt in FIR mode and retain the complete cancellation provided by an IIR structure; in effect, the best attributes of FIR and IIR filtering can be combined.

Figure 3A:
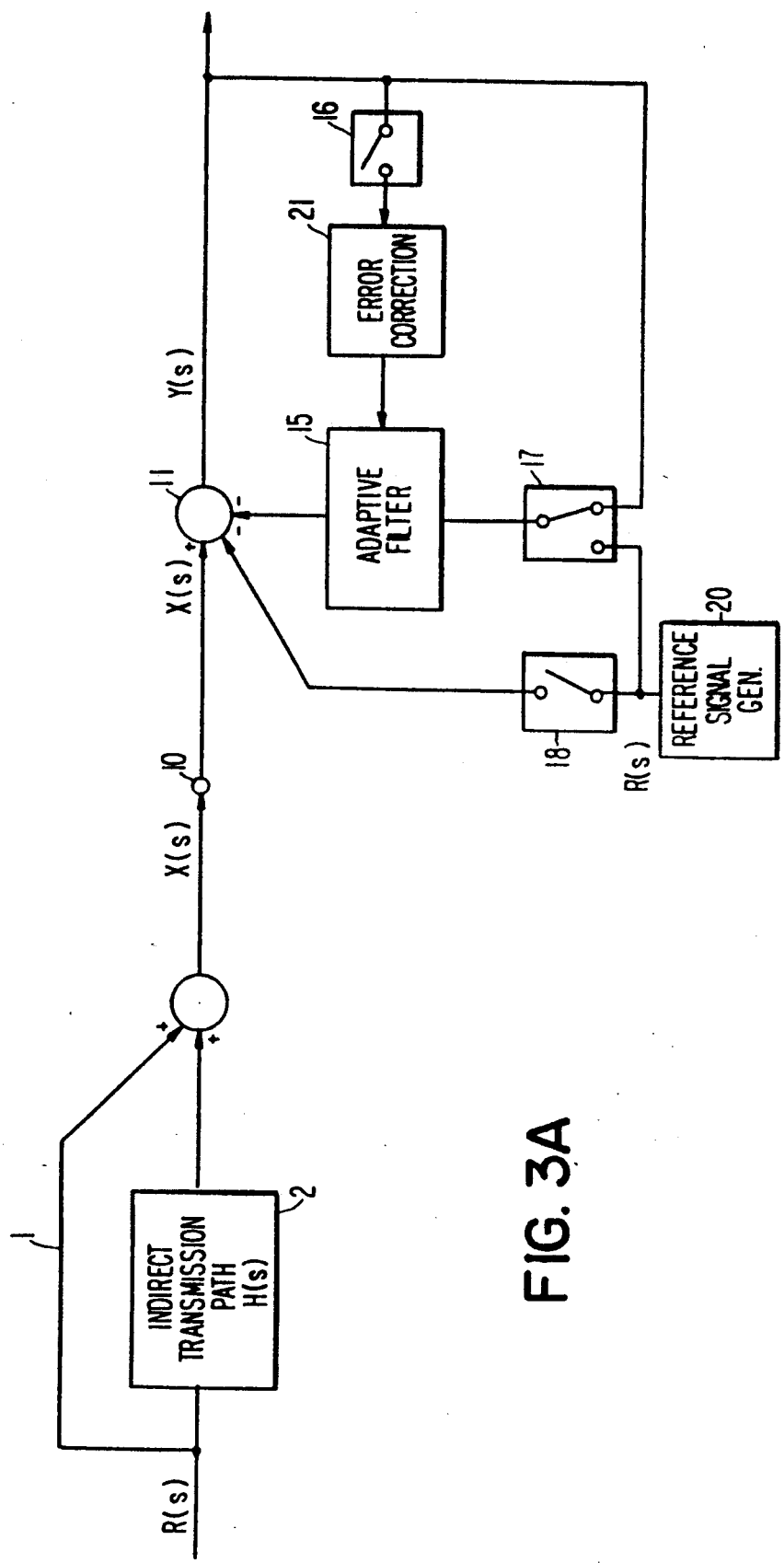
FIG. 3A illustrates a novel ghost cancellation circuit.

FIG. 3A illustrates an adaptive ghost cancellation circuit according to the invention. This circuit operates in a convergence mode or adaptation in which adaptation takes place, and in a ghost cancellation mode. It requires only a single FIR adaptive filter.

The signal transmission path is represented as comprising a direct path 1 as well as an indirect path 2 having a transfer function H(s), the former representing direct reception and the latter reception due only to an echo. The combined signals of these two path components is applied to the ghost canceller circuit at input 10. It should be kept in mind that elements 1, 2 and the indicated summation are not physical elements of the system, but representations of the signal transmission path. The physical invention starts at input 10.

If a reference signal R(s) is transmitted as part of the video signal, its component X(s) of the received signal is given by $$X(s) = R(s) [1 + H(s)] \quad (8)$$

and is applied to the subtracter circuit 11. The ghost cancellation circuit is illustrated in the cancellation mode in which the output Y(s) of the subtracter circuit 11 is applied to an adaptive filter 15, and the filter output is fed back to the subtracter circuit 11. Thus, the ghost cancellation circuit output is given by $$Y(s) = X(s) \{1 + H'(s, T_c)\}^{-1} \quad (9)$$

If H'(s,t)=H(s) after convergence time T, then $$Y(s) = R(s)[1 + H(s)][1 + H'(s, T_c)]^{-1} \quad (10)$$

As can be seen, if $H'(s, T_c) \approx H(s)$, complete ghost cancellation is approached. This adjustment of $H'(s, T_c)$ occurs in the convergence or adaptation mode, where $H'(s, T_c)$ performs system identification of echo channel 2 having transfer function H(s).

In the convergence mode the switches 16, 17 and 18 are set to the positions opposite those shown in the drawing. The reference signal generator 20 develops a reference signal identical to the predetermined reference signal R(s) in the received video signal, and this reference signal is applied through the respective switches 17 and 18 to the adaptive filter 15 and to the subtracter circuit 11. The circuit through switch 18 corresponds to the direct transmission path 1 and the circuit through switch 17 corresponds to the echo signal path. Consequently, the sum of the inputs to the subtracter circuit 11 should be X(s) and −X(s) so that the subtracter circuit output Y(s) effectively be null.

Any non-zero value for Y(s) can be thought of as an error signal representative of the difference between the indirect path transfer function H(s) and the filter transfer function H'(s, $t_c$). This error signal is applied through switch 16 to the block 21 marked error correction. This block represents a circuit for determining the magnitude of the error signal and for determining the optimum filter tap sights to reduce the error according to some criterion such as the least mean square error. It could be physically realized by a microprocessor based microcomputer for calculating the top weights according to the equations derived below. The important point is that in the convergence mode the FIR filter 15 is tuned so that its transfer function is made to replicate the indirect signal path.

Figure 3B:
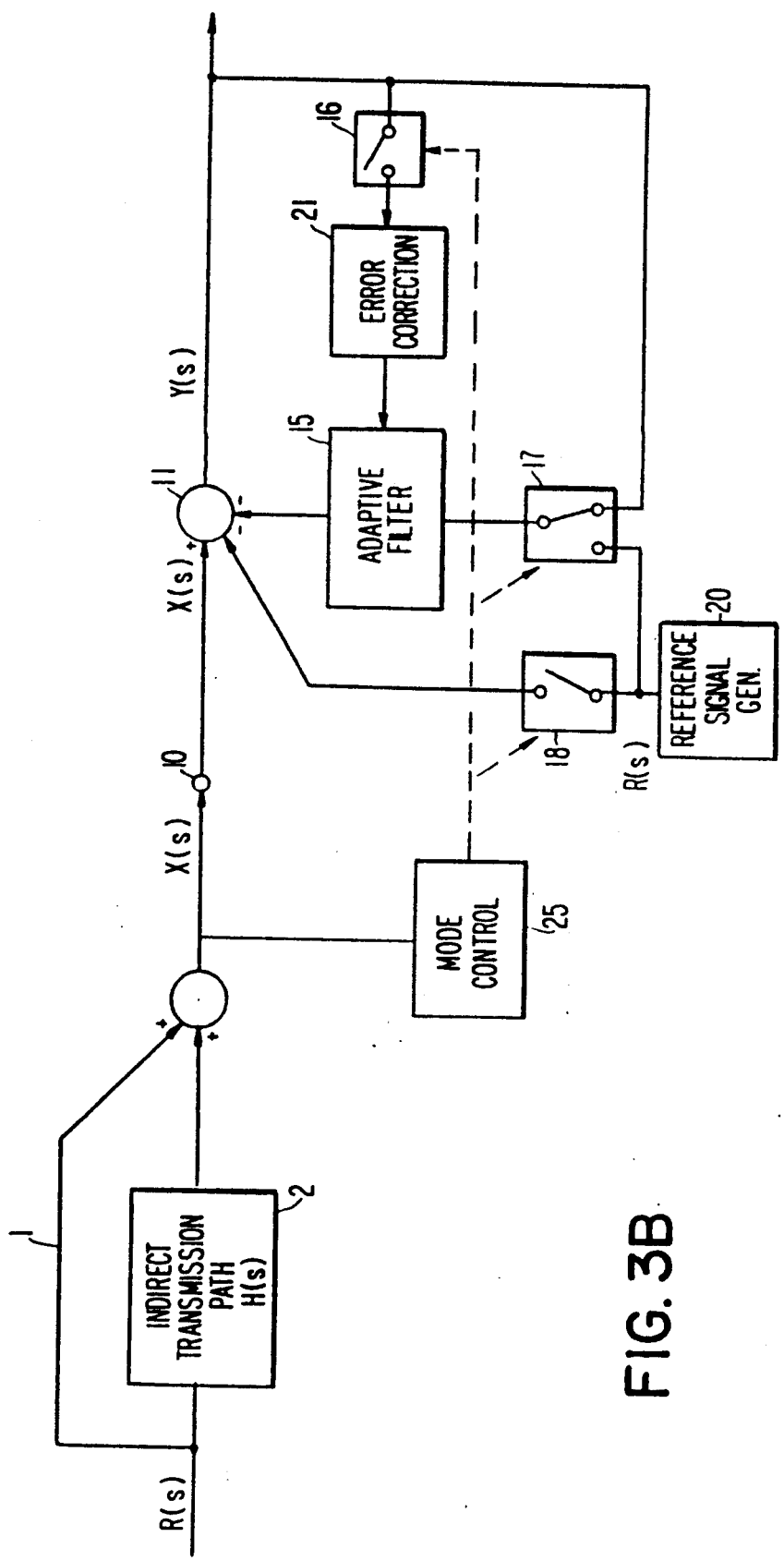
FIG. 3B illustrates the ghost cancellation circuit of FIG. 3A with additional control structure.

FIG. 3B illustrates the ghost cancellation circuit according to the invention shown in FIG. 3A but with control for switching between operating modes.

Control circuit 25 is responsive to the received video signal for determining when the video retract interval occurs. Control circuit 25 applies a control signal to the switches 16, 17 and 18 to switch them to the settings for the convergence mode during the vertical retrace interval so that the transmitted reference signal R(s) can be used for adaptation of the filter 15. During the reception of the image part of the video signal the switches 16, 17 and 18 are set for the ghost cancellation mode. Switching between convergence and ghost cancellation modes occurs every time a reference VITs appears, creating the effect of having an IIR adaptive filter continuously available to process the picture.

The indirect or echo channel discrete transfer function, h(n), is sparse because most of the response values over time are zero or insignificant. In the convergence mode, a FIR filter is tuned to replicate the echo transfer function; therefore, many multipliers along the delay taps of the transversal filter are of '0' value, meaning they effectively are unused. Consequently, a FIR filter with a reduced number of moveable multipliers can be employed; multipliers are placed to replicate the clustering properties of the echo transfer function.

Figure 4A:
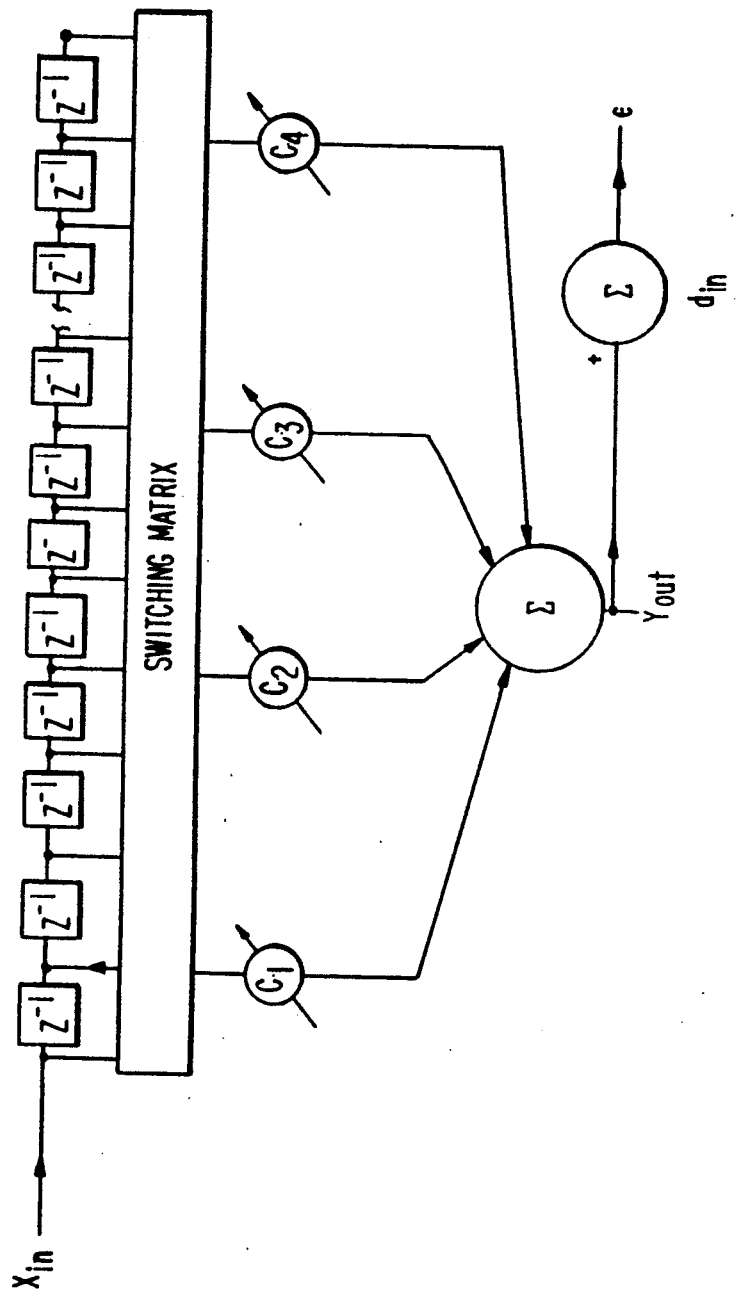
FIGS. 4A and 4B illustrate the circuits of a novel adaptive sparse transversal filter used in the ghost cancellation circuits of FIGS. 3A and 3B.
Figure 4B:
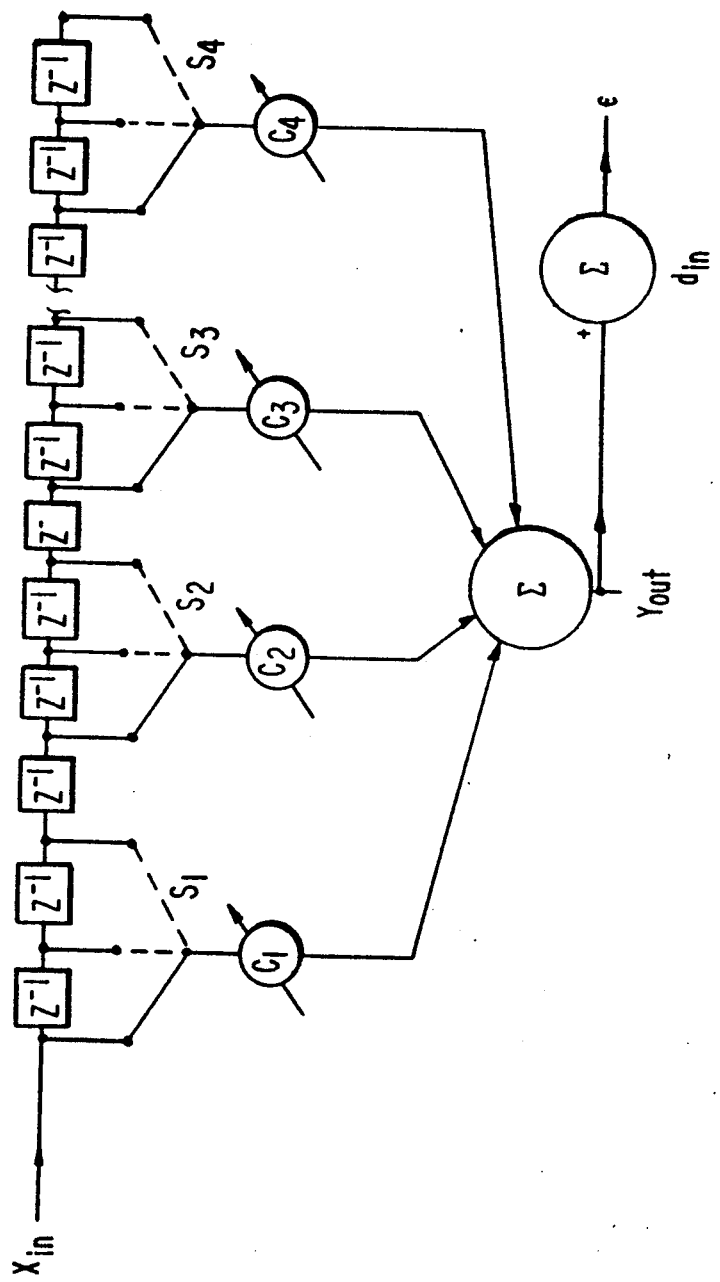

FIG. 4 shows the adaptive cluster transversal filter. Considering adaptation, our problem is to distribute the multipliers only to the tap locations where they are needed and then adjust them to the correct value. This new filter structure is equivalent to a normal M tap FIR filter having M-N of the multipliers set to zero; his kind of tap weight pattern would be expected when identifying a non-smeared or smeared echo sequence that could be approximated by N active components. Suppose that the N multipliers are distributed in a known pattern that is different from the correct pattern of the active taps required to replicate the echo. We can find out how the optimum associated with this known tap weight pattern is related to that of the global optimum of the filter having multipliers at all M taps. In fact, if we only know the optima of a sufficient number of different patterns containing N multipliers, we can combine this information to reconstruct what would be the global M tap optimum. The zero and non-zero taps can then be identified, leading to the correct multiplier distribution. We call this filter an adaptive sparse transversal filter.

Figure 5:
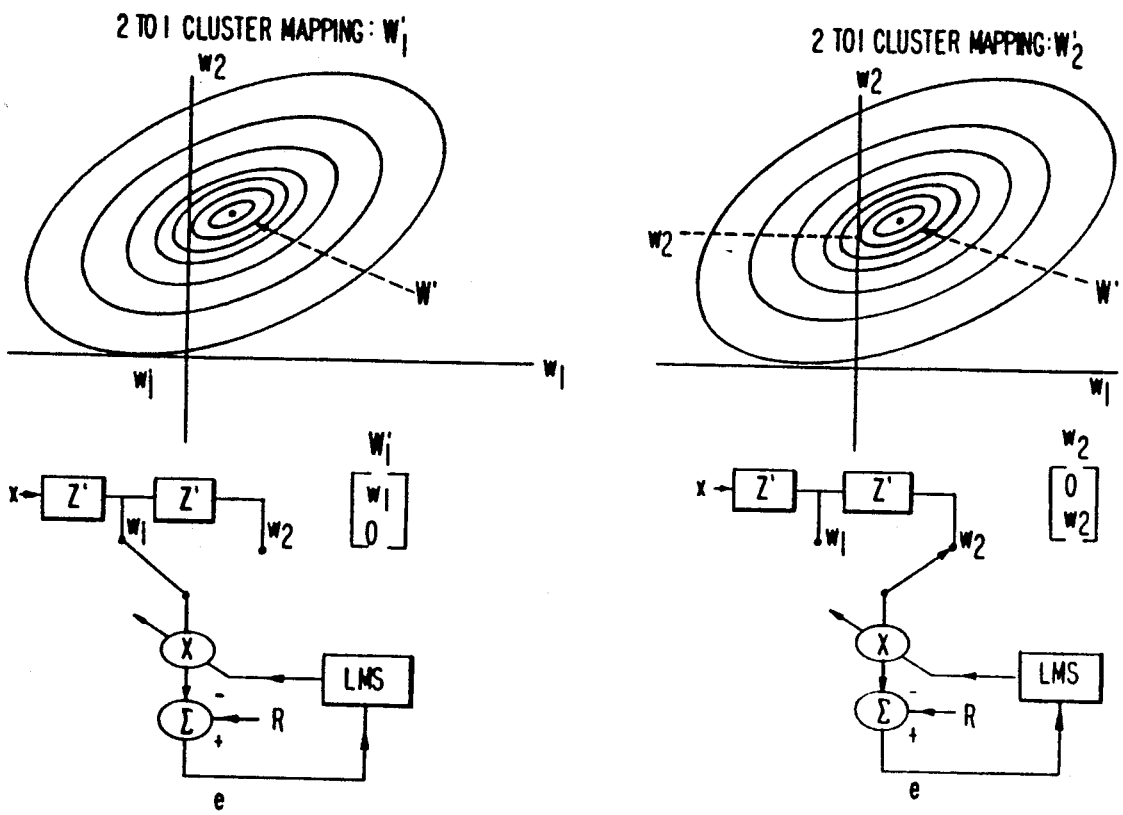
FIG. 5 shows an example of the filter of FIG. 4 having two filter taps.
Figure 5:
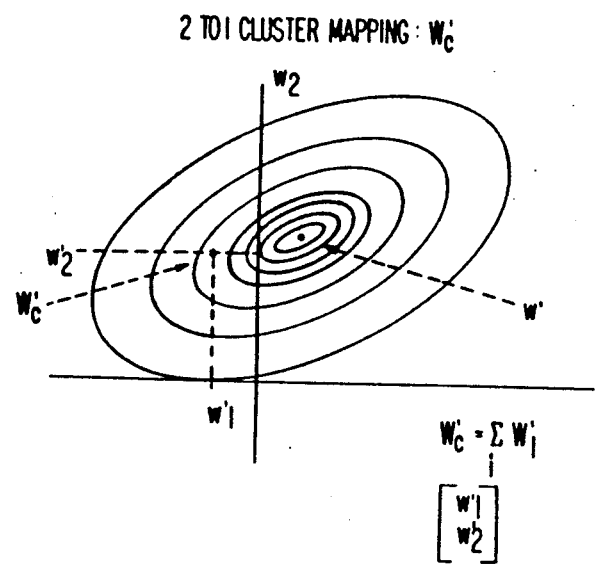

The situation is elaborated in the two tap example of FIG. 5. The single multiplier is first connected to the left delay tap and is optimized to setting $W_1'$. When connected to the right delay tap, the optimum is found to be $W_2'$. After combining these coordinates to form $W_c^*$ it is seen that this is a point different from global optimum $W^*$. Below, we derive a linear mapping $A_c$ that can relate $W_c^*$ to $W^*$. In the formulation, there are N multipliers to be distributed among M taps of the transversal filter.

To start, Eqs. (3) and (4) are combined so that the gradient is written with respect to $W^*$, where $R = E[XX^T]$, as follows.

$$\nabla = 2RW - 2RW^* \quad (11)$$

Since the search for minima is being constrained to certain components of W being held to '0', we define switching matrix $S = \text{diag}\{s_K\}$, $s_K = 1, 0$. $s_K = 1$ corresponds to taps having multiplier, where $s_K = 0$ is the converse, and the following holds $$\Sigma S_K = N \text{ over } K = 1 \text{ to } M$$

Multiplying W by S thus nulls the appropriate elements. We additionally wish to pre-null corresponding elements of vector $\nabla$ so as to ignore those components in the optimization procedure. Since some of the elements of W are constrained, the remaining free elements can assume a different optimal solution than the original solution obtained in (3) and (4). To distinguish this new solution, the constrained weight vector will be called $W_s$. The constrained optimum, $W_s^*$, is obtained by setting $S\nabla = 0$, as displayed below. Setting $= 0$ and solving for $W_s$ yields the constrained optima, as shown below.

$$S\nabla = S[2RSW_s - 2RW^*]$$

$$[SRS]W_s^* = [SR]W^* \quad (12)$$

Eq. (12) is written in $R^N$ space, where (11) is in $R^M$; $N < M$. The subspace operations of (12) are necessary as a pre-requisite for finding the relationship of $W_c^*$ and W in $R^M$. MXM matrix [SRS] is singular since its rank $\leq N$, since not all $S_K = 1$. Consequently, we cannot invert [SRS] directly. We instead need to work with a sub-matrix derived from [SRS] that performs mappings on the non-nulled sub-space of W-space. This NXN sub-matrix can be constructed by permutating all the null columns of [SRS] to the right and null rows to the bottom, leaving the sub-matrix nested in the upper left corner of the full MXM matrix. We note that to preserve correspondence, elements of $W_s^*$ are permutated in the same fashion as the column of [SRS], and the rows of [SR] are permutated to match the rows of [SRS]. A matrix Z will be constructed to perform the permutations. Pre-multiplying by Z permutates a matrix's rows while post-multiplying by $Z^T$ permutates the columns. The equation below shows how Z is formed from $S = \text{diag}\{sK\}$, where $K = 1, \ldots, M$.

(13)

$$1 \text{ if } i = s_K \left[ \sum_{i=1,K} s_i \right] + [1 - s_K] \left[ \sum_{i=1,M} s_i + \sum_{i=1,K} (1 - s_i) \right]$$

$$Z = [z_{i,k}] = 0 \text{ otherwise } K = 1, M$$

In (13), Z starts from an all null MXM matrix where '1' elements are added only at the indices indicated. While column index 'j' is scanned as 'K' goes from 1 to M row index 'i' is incremented by 1 starting from 0 each time $s_K = 1$; when $S_k = 0$, the row index is also incremented by 1 but starts from $$\Sigma S_i = \text{over } j = 1 \text{ to M}.$$

Figures 6, 7:
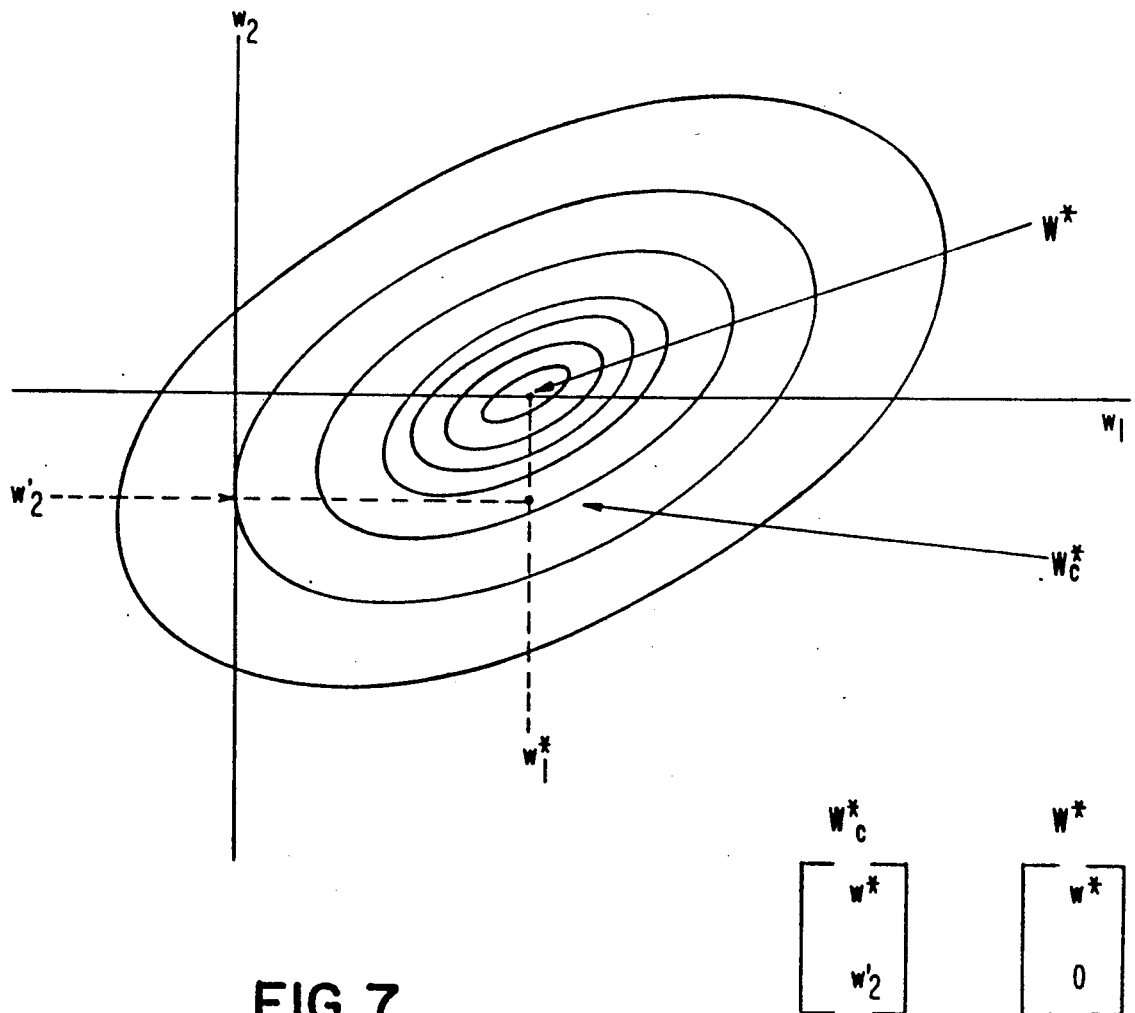
FIG. 6 is a matrix structure described in the specification.
FIG. 7 is a transformed error surface derived from the error surface of FIG. 2.

Thus, every row and column has a single '1' in it with the rest of the elements being '0'. An example is shown in FIG. 6 to aid understanding.

The submatrix of $ZSRSZ^T$ can be constructed to be non-singular since it is a function of R and S, both under our control, and not dependent on echo h(n). Z has the following properties:

$$ZZ^T = I \text{ and } Z^T = Z^{-1} \quad (14)$$

Applying the described permutation to (12), yields $$[Z \, SRS \, Z^T] Z W_s^* = [Z \, SR] W^* \quad (15)$$

Considering the non-nulled elements of vectors to be active, we have defined the transformation $W^* \to [Z \, SR]W^*$ which is a mapping $R^M \to R^N$. Similarly, the bottom M-N elements of $ZW_s^*$ are nulled by the zero elements in nested matrix $[Z \, SRS \, Z^T]$, making both sides of (15) elements of $R^N$. We therefore write (15) as $$R'(Z \, W_s^*)' = ([Z \, SR]W^*)'$$

where the apostrophe indicates the bottom nulled elements of the vectors have been truncated, making them N dimensional; additionally, R' is an NXN invertible matrix corresponding to $[Z \, SRS \, Z^T]$. With this, $(ZW_s^*)$; can be solved, however, it is desirable to find the solution and preserve the identity of the nulled vector elements for later operations. To solve (15) as described, operation $-1\square$ is defined to perform inversion only on the nested sub-matrix within $[Z \, SRS \, Z^T]$ and place this new matrix back in the same position as the original sub-matrix. Therefore, $$Z \, W_s^* = [Z \, SRS \, Z^T]^{-1\square} Z \, SR \, W^* \quad (16)$$

To further simplify we note that $[Z \, SRS \, Z^T]^{-1} = Z \, SQS \, Z^T$ for some matrix Q having corresponding elements to inverse sub-matrix of R', also $S = S^n$. Applying this to (16) and using (14) yields $$Z \, W_s^* = [ZSRSZ^T]^{-1\square} ZRW^* \quad (17)$$

Finally using (17) and (14) we obtain $$W_s^* = Z^{-1} [ZSRSZ^T]^{-1\square} Z^T R W^* \quad (18)$$

In (18) the nulled elements of $W_s^*$ are not only preserved, but also permutated to match corresponding elements of $W^*$. The active elements of $W_s^*$ relate in order, to the $s_K = 1$ elements in $S = \text{diag} \{s_K\}$. To summarize, (18) takes R, nulls out appropriate rows and columns, permutates remaining rows and columns to form an N×N sub-matrix, inverts the sub-matrix, and de-permutates the inverted submatrix so that elements occupy the original non-nulled locations creating a 'sub-space inverse of R'. This 'subspace inverse of' R is post multiplied by R yielding the $R^M \rightarrow R^N$ mapping $W^* \rightarrow W_s^*$ having preserved nulled elements.

Suppose that $W_{si}^*$ correspond to switching matrices $S_i$, i=1, ..., T with $$\Sigma s_i = I \quad i=1 \text{ to } T$$

Then, there are subspaces $E^{Ni} \subset R^M$, with $W_{si}^* \epsilon E^{Ni}$ and $\cap_i E^{Ni} = \phi$ and $\cup_i E^{Ni} = R^M$. Accordingly we can build $W_c$ in $R^M$ from the $E^{Ni}$ subspaces as shown; using (18), $$W^*_c = \sum W^*_{si} = \sum [Z_i^{-1} \quad (19a)$$
$$[Z_i S_i R S [Z_i^{-1}]^{T-1} Z^{T-1}] R W^*, T$$

$$W^*_c = R_c^{-1} R W^* = A_c W^* \quad (19b)$$

(19a) and (19b) are $R^M \rightarrow R^M$, and $A_c$ is invertible.

It is clear how subspace optima, $W_i'$, in FIG. 5 are constructed. Since (18) shows that only one optimum exists for a given matrix S (or subspace), the optimum must be found on the contour tangent to the axis constraining the sub-space.

Now that mapping $A_s$ has been found, it is easy to see how a cluster can be formed. Referring to the two tap example of FIG. 7, we see that $W_c^*$ is constructed in the same manner as in FIG. 5. Both components of $W_c^*$ are non-zero. If we were to use (19) and then find $A_c^{-1}$, the global optimum, $W^*$, can be calculated. Notice that $W^*$ has a single non-zero component, hence, only one multiplier is needed is this simple cancellation filter.

3. Examples

Combing:

A switching pattern that meets the conditions needed to obtain a valid $W_c^*$ usable in (19) is the comb. We will describe a 3 to 1 comb, but this approach is not restricted to a 3 to 1 ratio. Assuming that the transversal filter in FIG. 4 has M taps, let us say that we find (for example) the worst case echo requires that only N multipliers are needed in this structure at any given time. Let M=3N. To form this comb, distribute the N weights evenly over the 3N tp as, leaving a gap of 2 taps between multipliers. The comb can be advanced. More specifically:

(i) Distribute N weights evenly over the first of every third 3N taps; LMS converge and store weight values forming $W_{s1}^*$ (ii) Distribute N weights evenly over the second of every third 3N taps; LMS converge and store weight values forming $W_{s2}^*$ (iii) Distribute N weights evenly over the third of every third 3N taps; LMS converge and store weight values forming $W_{s3}^*$ (iv) Combine stored weight values forming $W_c^*$ In the sequence described, the comb advances position only after each $W_{si}$ has converged to its final value. A useful variation would be to advance the comb after each LMS cycle of (7) thus updating $W_c^*$ every 3 cycles. Intermediate values of $W_c^*$ provided with this "cyclic comb" may be desirable in giving continuous subjective improvements to the picture as final convergence is reached.

1. Clustering with R=Λ a) Find $W_c^*$ either by advancing or cyclic comb.

b) Select N non-zero values of weights; assign the N multipliers to related locations and set to corresponding weight values. (Some components of $W_c^*$ would only be zero under ideal conditions with perfect convergence. The correct objective could be achieved by selecting the N maximum magnitude weight values).

2. Clustering with R≠Λ

This algorithm uses steps a) and b) from above. However, the following intermediate step must be added between a) and b).

a') calculate $W^* = A_c^{-1} W_c$. $W^*$ is used in step b). Since $A_c^{-1}$ is a function of R and $\{S_1, \ldots, S_T\}$, it may be precalculated and stored. It is best to find a reference signal and switching pattern (i.e. a different comb ratio) to lead to a very simple $A_c^{-1}$ structure, as this will facilitate multiplication later.

Figure 8:
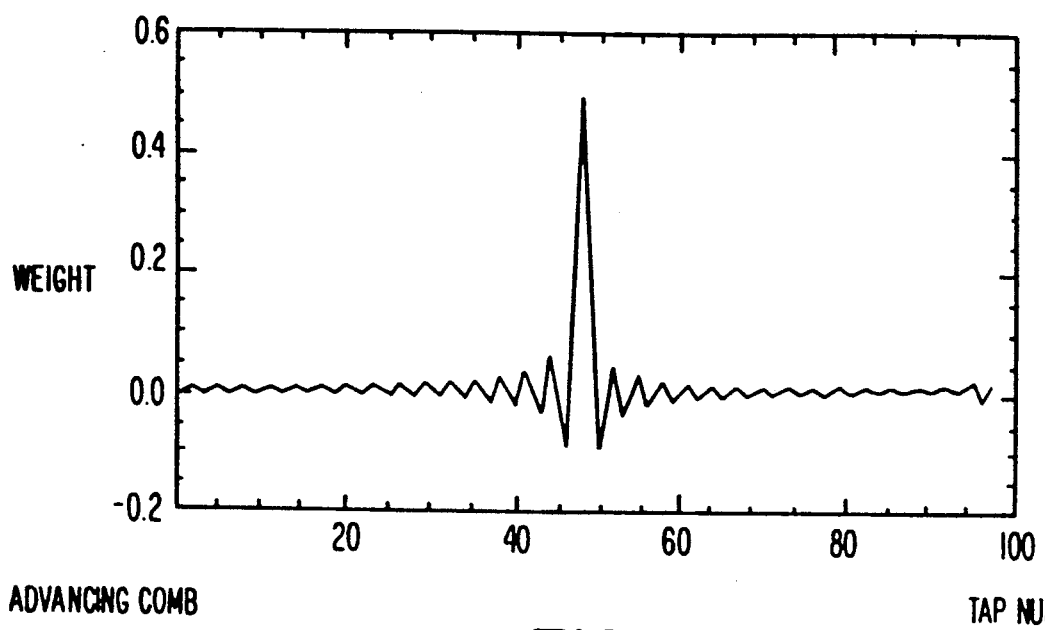
FIGS. 8 and 9 are the results of simulation of the ghost cancellation circuits.
Figure 9:
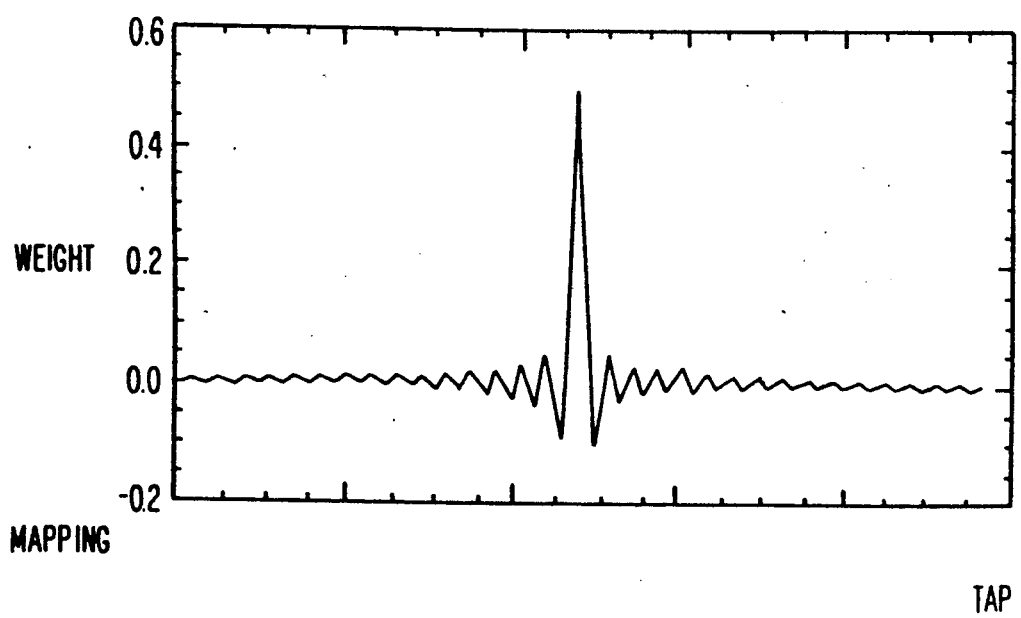

In simulations, a sin x/x reference signal R(s) was chosen for its smooth spectral characteristics (any frequency null would make tuning at that point indeterminate). To match video bandwidth, the sin x/x rolloff was set at 5 MHz. Sampling was done at 3× bandwidth with a 3 to 1 comb switching pattern. $A_c$ was calculated using (19) and found to be practically indistinguishable from $(1/r_{ii})R$. To show the utility of the mapping, a single echo that can be described as having $W^* = \{0,0, \ldots, 1, \ldots, 0, 0\}$ was processed with a 3 to 1 Advancing Comb (with LMS as described in this section under 'Combing') to obtain $W_c^*$. $W^*$ was also mapped through $A_c$ to find $W_c^*$ according to (19b). FIG. 8 shows the results of the Advancing Comb while FIG. 9 that of the mapping.

Figure 10:
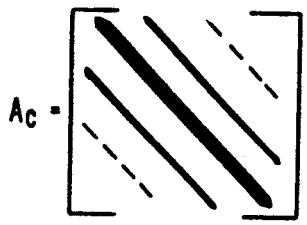
FIG. 10 illustrates a particular technique of ghost cancellation circuit adaptation.
Figure 10:
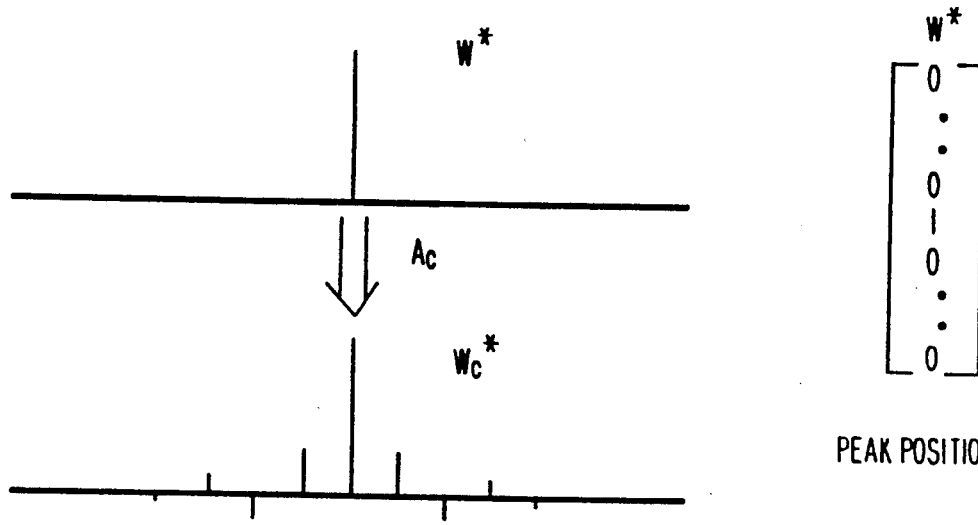
Figure 10:
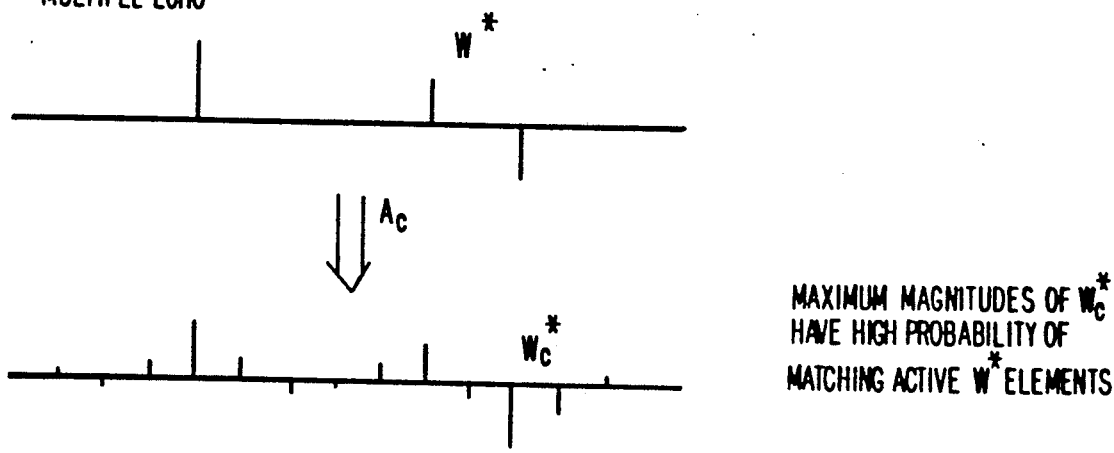

Another embodiment of the invention will be discussed with reference to FIG. 10. A single echo is mapped through matrix $A_c$, which is effectively Toplitz (i.e., $A_c = \{a_{ij}\} = \{a_{i-j}\}$), and has a very dominant main diagonal. As in FIG. 9, the impulse of $W^*$ is mapped to an impulse with side-lobes in $W_c^*$. The peak position of $W_c^*$ is the same as the $W^*$ pulse. Because of the described structure of $A_c$, we can say that any component of $W^*$ maps to the same spot in $W_c^*$ with similar side-lobes; superposition can therefore be applied for multiple echoes. In this case the maximum magnitude components of $W_c^*$ have a high probability of matching the non-zero elements of $W^*$. If it is known a priori that the most complex echo will have ≦N components, then it is highly likely that these will be the N maximum components of $W_c^*$. This relationship would not work if the side-lobe of an echo sufficiently lowered the peak amplitude of another echo so as to not be counted in the set of N selected $W_c^*$ elements; the more dominant the main diagonal of $A_c$, the less likely this event.

3. Course-Fine Clustering Projecting Forward through $A_c$ for a 3× sampled sin x/x; 3 to 1 comb.

a) Find $W_c^*$ either by advancing or cyclic comb b) Select N maximum magnitude elements of $W_c^*$; assign the N multipliers to related locations and set to corresponding weight values (considered as initial condition)

c) With the weights set as in b), preform final LMS convergence. This fine tunes the weights to match $W^*$.

Selection of the maximum magnitude elements in step b) can be by a predetermined threshold, or by setting a threshold value so that the number of elements of $W_c^*$ having values exceeding the threshold equals N.

What is claimed is:

1. An adaptive ghost cancellation circuit, comprising:
   subtracting means for receiving in operation a video signal which includes a reference signal and for subtracting signals applied thereto from the video signal;
   an adaptive finite impulse response filter having an output connected to said subtracting means for the subtraction of a filter output signal from the video signal applied to said subtracting means;
   reference signal generating means for generating a reference signal identical to the reference signal contained in the video signal applied to said subtracting means; and
   mode switching means for operating the cancellation circuit in a convergence mode and in a ghost cancelling mode, said mode switching means applying in said convergence mode, the reference signal from said reference signal generating means to the input of said adaptive filter and to said subtracting means and applying the output of said subtracting means to said adaptive filter for adjusting the adaptive filter characteristics to converge toward the characteristics of the ghost signal path, and said mode switching means ending in said ghost cancelling mode, the application of the reference signal from said reference signal generating means to said subtracting means and applying the output of said subtracting means to the input of said adaptive filter after convergence to cancel ghost signals from the video signal.

2. An adaptive ghost cancellation circuit according to claim 1, wherein said adaptive finite impulse response filter is an adaptive sparse transversal filter.

3. An adaptive ghost cancellation circuit according to claim 1, wherein said adaptive filter is comprised of:
   a plurality of delay elements connected in series and having an input end and an output end;
   a plurality of multipliers each connectable to the respective output of a different one of said plurality of delay elements, wherein the number of multipliers is less than the number of delay elements;
   means for connecting selected ones of the multipliers to the outputs of respective ones of the delay elements; and summing means for summing the output signals of said multipliers and for developing an output signal constituting the output of the finite impulse response filter.

4. An adaptive ghost cancellation circuit, comprising:
   an adaptive sparse transversal filter;
   a subtracter circuit which receives in operation a video signal incorporating a vertical interval test signal which includes a predetermined reference signal;
   a reference signal generator for generating a reference signal identical to the reference signal contained in the video signal;
   means for operating the ghost cancellation circuit in an adaptive mode, said means responsive to the vertical interval test signal for applying the reference signal from said reference signal generator to said adaptive sparse transversal filter for filtering the reference signal and for applying the reference signal and the filtered reference signal to said subtracter circuit during the occurrence of the reference signal in the received video signal and for applying the output of said subtracter circuit to said adaptive sparse transversal filter; and
   means for operating the ghost cancellation circuit in a cancellation mode by ending the application of reference signal generated from said reference generating means to said adaptive sparse transversal filter and output of said subtracter circuit to said adaptive sparse transversal filter and applying the output of said subtracter circuit to the input of said adaptive sparse transversal filter and the filtered subtracter circuit output signal to said subtracter circuit for cancelling ghost signals from the video signal applied to said subtracter circuit.

5. An adaptive ghost cancellation circuit according to claim 4, wherein said adaptive filter is comprised of:
   a plurality of delay elements connected in series and having an input end and an output end;
   a plurality of multipliers each connectable to the respective output of a different one of said plurality of delay elements, wherein the number of multipliers is less than the number of delay elements;
   means for connecting selected ones of the multipliers to the outputs of respective ones of the delay elements; and summing means for summing the output signals of said multipliers and for developing an output signal constituting the output of the finite impulse response filter.

* * * * *